United States Patent
Kwisthout

(10) Patent No.: US 11,262,058 B2
(45) Date of Patent: Mar. 1, 2022

(54) LIGHTING DEVICE AND METHOD FOR MANUFACTURING A LIGHTING DEVICE

(71) Applicant: SIGNIFY HOLDING B.V., Eindhoven (NL)

(72) Inventor: Cornelis Wilhelmus Kwisthout, Breda (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/426,659

(22) Filed: May 30, 2019

(65) Prior Publication Data
US 2019/0277483 A1    Sep. 12, 2019

Related U.S. Application Data

(63) Continuation of application No. 14/987,369, filed on Jan. 4, 2016, now Pat. No. 10,330,297, which is a (Continued)

(30) Foreign Application Priority Data

Dec. 22, 2010   (EP) ..................... 10196396

(51) Int. Cl.
| | |
|---|---|
| F21K 9/61 | (2016.01) |
| F21V 23/00 | (2015.01) |
| F21S 10/00 | (2006.01) |
| F21K 9/232 | (2016.01) |
| F21V 8/00 | (2006.01) |
| F21K 9/238 | (2016.01) |

(Continued)

(52) U.S. Cl.
CPC ........... *F21V 23/003* (2013.01); *F21K 9/232* (2016.08); *F21K 9/238* (2016.08); *F21K 9/61* (2016.08); *F21S 10/005* (2013.01); *G02B 6/001* (2013.01); *G02B 6/0021* (2013.01); *F21W 2121/00* (2013.01); *F21Y 2103/10* (2016.08); *F21Y 2107/00* (2016.08); *F21Y 2107/70* (2016.08); *F21Y 2113/13* (2016.08); *F21Y 2113/20* (2016.08); *F21Y 2115/10* (2016.08)

(58) Field of Classification Search
CPC ...... F21Y 2113/20; F21S 10/005; F21K 9/61; G02B 6/001
See application file for complete search history.

(56) References Cited

U.S. PATENT DOCUMENTS

| | | | |
|---|---|---|---|
| 5,924,784 A * | 7/1999 | Chliwnyj | ............ H05B 37/029 362/234 |
| 6,580,228 B1 | 6/2003 | Chen et al. | |

(Continued)

FOREIGN PATENT DOCUMENTS

| | | |
|---|---|---|
| CN | 10110747 A | 1/2008 |
| CN | 201032086 Y | 3/2008 |

(Continued)

*Primary Examiner* — Julie A Bannan

(57) ABSTRACT

A lighting device for providing decorative lighting is disclosed. In one embodiment, the lighting device comprises a base, said base comprises a base for retro-fitting a traditional incandescent light bulb, a continuous optical element in which a string of a plurality of light emitting diodes is arranged, and an envelope encapsulating said continuous optical element such that the lighting device resembles a traditional incandescent light bulb.

9 Claims, 2 Drawing Sheets

Related U.S. Application Data continuation of application No. 13/996,778, filed as application No. PCT/IB2011/055565 on Dec. 9, 2011, now Pat. No. 9,234,635.

(51) Int. Cl.
*F21Y 115/10* (2016.01)
*F21Y 113/13* (2016.01)
*F21Y 113/20* (2016.01)
*F21W 121/00* (2006.01)
*F21Y 107/00* (2016.01)
*F21Y 107/70* (2016.01)
*F21Y 103/10* (2016.01)

(56) References Cited

U.S. PATENT DOCUMENTS

| | | |
|---|---|---|
| 6,586,882 B1 | 7/2003 | Harbers |
| 7,455,444 B2 | 11/2008 | Chien |
| 7,476,002 B2 | 1/2009 | Wolf et al. |
| 7,484,860 B2 | 2/2009 | Demarest et al. |
| 7,618,175 B1 | 11/2009 | Hulse |
| 7,988,323 B2 * | 8/2011 | Johnson, III ....... H05B 33/0803 362/228 |
| 2002/0047516 A1 | 4/2002 | Iwasa et al. |
| 2002/0118538 A1 * | 8/2002 | Calon ..................... H01J 61/56 362/236 |
| 2002/0118583 A1 | 8/2002 | Nakazono |
| 2003/0147245 A1 | 8/2003 | Chen |
| 2005/0052885 A1 | 3/2005 | Wu |
| 2005/0099108 A1 | 5/2005 | Hofmann et al. |
| 2005/0105302 A1 | 5/2005 | Hofmann et al. |
| 2005/0122742 A1 * | 6/2005 | Ho ............................ F21S 4/28 362/615 |
| 2006/0152946 A1 | 7/2006 | Chien |
| 2006/0226795 A1 | 10/2006 | Walter et al. |
| 2006/0238136 A1 | 10/2006 | Johnson, III et al. |
| 2007/0121319 A1 | 5/2007 | Wolf et al. |
| 2007/0139949 A1 | 6/2007 | Tanda et al. |
| 2007/0267976 A1 * | 11/2007 | Bohler ................... B82Y 10/00 315/112 |
| 2008/0074867 A1 | 3/2008 | Chen |
| 2008/0137332 A1 * | 6/2008 | Lo ............................ F21S 4/24 362/240 |
| 2008/0137360 A1 | 6/2008 | Van Jijswick et al. |
| 2009/0059593 A1 | 3/2009 | Tsai |
| 2009/0154167 A1 * | 6/2009 | Lin ........................ F21V 29/773 362/294 |
| 2009/0212698 A1 | 8/2009 | Bailey |
| 2009/0251882 A1 | 10/2009 | Ratcliffe |
| 2009/0290334 A1 | 11/2009 | Ivey et al. |
| 2010/0002444 A1 | 1/2010 | Konaka |
| 2010/0164409 A1 | 7/2010 | Lo et al. |
| 2010/0320903 A1 * | 12/2010 | Yu .............................. F21V 3/00 315/32 |
| 2011/0001440 A1 | 1/2011 | Deurenberg et al. |
| 2011/0050073 A1 * | 3/2011 | Huang ...................... F21K 9/00 313/46 |
| 2011/0180824 A1 | 7/2011 | Tan et al. |
| 2012/0182757 A1 | 7/2012 | Liang et al. |
| 2013/0077285 A1 | 3/2013 | Isogai et al. |
| 2014/0240990 A1 * | 8/2014 | Bae ........................ F21K 9/232 362/294 |

FOREIGN PATENT DOCUMENTS

| | | |
|---|---|---|
| CN | 201513800 U | 6/2010 |
| CN | 101482237 B | 9/2010 |
| EP | 2073853 A2 | 7/2009 |
| EP | 2292970 A2 | 3/2011 |
| EP | 2444722 A1 | 4/2012 |
| JP | 2005514752 A | 5/2005 |
| RU | 2178588 C1 | 1/2002 |
| RU | 2185567 C2 | 7/2002 |
| RU | 2265156 C2 | 11/2005 |
| RU | 52318 U1 | 3/2006 |
| TW | 569980 U | 1/2004 |
| TW | M376709 U | 3/2010 |
| TW | 201037212 A | 10/2010 |
| WO | 0050809 A1 | 8/2000 |
| WO | 200063977 A1 | 10/2000 |
| WO | 03059012 A1 | 7/2003 |
| WO | 2003059012 A1 | 7/2003 |
| WO | 2006035349 A2 | 4/2006 |
| WO | 2008134056 A1 | 11/2008 |
| WO | 2010030336 A1 | 3/2010 |
| WO | 2010070557 A1 | 6/2010 |
| WO | 2010106472 A1 | 9/2010 |
| WO | 2010110652 A1 | 9/2010 |

* cited by examiner

LIGHTING DEVICE AND METHOD FOR MANUFACTURING A LIGHTING DEVICE

CROSS-REFERENCE TO PRIOR APPLICATIONS

This application is a continuation of U.S. Ser. No. 14/987,369, filed Jan. 6, 2016, which is a continuation of U.S. Ser. No. 13/996,778, filed Jun. 21, 2013 which is the U.S. National Phase application under 35 U.S.C. § 371 of International Application No. PCT/IB2011/055565, filed Dec. 9, 2011, which claims the benefit of European Application No. 10196396.5, filed Dec. 22, 2010. These applications are hereby incorporated by reference herein.

FIELD OF THE INVENTION

The present invention generally relates to the field of lighting devices.

BACKGROUND OF THE INVENTION

Traditional incandescent light bulbs are available in various designs such as plain functional bulbs with different glass finishes (e.g. transparent, diffuse or colored) and decorative bulbs with complex filaments, wherein the filament itself serves a decorative purpose. However, due to demands on power saving in lighting devices, driven by eco awareness and legislation, traditional incandescent light bulbs are being replaced by more power efficient light sources such as fluorescent lamps and LED (light emitting diode) lamps. Such conventional eco-friendly lamps do not provide the same various designs as traditional incandescent light bulbs.

A solution of how to provide a lighting device resembling a carbon filament lamp is disclosed in WO 2006/035349. The document shows a lighting device comprising a solid state light source optically coupled to an optical fiber having an out-coupling surface. A drawback with such a lighting device is that it does not provide a sufficiently energy-efficient functional lighting (such as e.g. general lighting or task lighting).

SUMMARY OF THE INVENTION

Thus, there is a need for providing alternatives and/or new devices that would overcome, or at least alleviate or mitigate, at least some of the above mentioned drawbacks. It is with respect to the above considerations that the present invention has been made. An object of the present invention is to provide an improved alternative to the above mentioned technique and prior art.

More specifically, it is an object of the present invention to provide a lighting device enabling both decorative lighting and functional lighting with improved efficiency. It is also an object of the present invention to provide a method of manufacturing such a lighting device.

These and other objects of the present invention are achieved by means of a lighting device and a method of manufacturing the lighting device having the features defined in the independent claims. Preferable embodiments of the invention are characterized by the dependent claims.

Hence, according to a first aspect of the present invention, a lighting device is provided. The lighting device comprises a first light emitting element being optically coupled to a light guide having an out-coupling surface for illumination via the light guide. Further, the lighting device comprises a second light emitting element dedicated for direct illumination from the lighting device.

Further, according to a second aspect of the invention, a method of manufacturing a lighting device is provided. The method comprises the steps of providing a first light emitting element, providing a light guide having an out-coupling surface, and optically coupling the first light emitting element to the light guide. Further, the method comprises the step of providing a second light emitting element dedicated for direct illumination from said lighting device.

The basic idea of the invention is that the light emitted from the first light emitting element is emitted out of the lighting device via the light guide and the light emitted from the second light emitting element is emitted out of the lighting device directly from the second light emitting element. As a result, decorative lighting is provided by the light guide and the first light emitting element, and a direct illumination (suitable for functional lighting) is provided by the second light emitting element.

In this respect, with the term "direct illumination" it is meant that most of, or at least a considerable part of the light emitted from the second light emitting element is emitted from the lighting device without passing a light guide. The inventor has realized that the lighting device according to prior art suffers from energy-losses when the light emitted from the solid state light source is coupled into the optical fiber and then out again. Hence, the lighting device according to prior art may be improved with respect to functional lighting (such as e.g. general lighting or task lighting). Functional lighting may be defined as a type of lighting wherein it is desirable to output from the lighting device as much of the light emitted from the solid state light source as possible.

The present invention is advantageous in that the lighting device provides both a decorative appearance (look) and functional illumination, and is still energy-efficient since the light emitted from the second light emitting element is directly emitted from the second light emitting element without unnecessary energy-loss.

Further, the present invention is advantageous in that a double functionality (decorative lighting and functional lighting) is provided within a single lighting device, enabling an extended field of use since the lighting device may be used both in a decorative purpose and e.g. for general lighting or task lighting.

According to an embodiment of the present invention, the illumination from the lighting device via the light guide and the first light emitting element may be dedicated to a first type of lighting. Further, illumination from the lighting device from the second light emitting element without any light guide may be dedicated to a second type of lighting. Accordingly, the first type of lighting and the second type of lighting are functionally and structurally separated such that each type of lighting can be optimized in terms of energy-efficiency.

According to an embodiment of the present invention, the first light emitting element may be dedicated to decorative lighting (via the light guide, i.e. the first type of lighting as defined in the preceding embodiment) and the second light emitting element may be dedicated to functional lighting (without any light guide, i.e. the second type of lighting as defined in the preceding embodiment).

According to an embodiment of the present invention, the light intensity of the second light emitting element may be adjustable relative to the light intensity of the first light emitting element. Preferably the light intensity of the second light emitting element may be adjustable relative to the light intensity of the first light emitting element in response to an input signal to the lighting device. The input signal may be received at the lighting device from a dimmer connected to the lighting device (wherein the actual receiver of the dim signal is on the mains voltage). Alternatively, the input signal may be received at e.g. a low voltage circuitry of the lighting device (further described below) via a remote control (operated by a user of the lighting device). Preferably, a transfer function may be used such that the input voltage is correlated to a specific relationship or ratio between the intensity of the first light emitting element and the intensity of the second light emitting element. The present embodiment is advantageous in that it provides at least two different operation modes of the lighting device, a decorative mode for which the light intensity of the second light emitting element is lower than the light intensity of the first light emitting element and a functional mode for which the light intensity of the second light emitting element is higher than the light intensity of the first light emitting element. In other words, the light guide will become more visible and stand for a greater part of the total light-output from the lighting device when the light intensity of the second light emitting element is lowered in the decorative mode compared to when the lighting device is in the functional mode. In the functional mode, the light intensity of the second light emitting element will dominate the total light-output from the lighting device.

In an embodiment of the present invention, at least one of the second light emitting element and the first light emitting element may be dimmable, which is advantageous in that it provides a step-less transition between the two above-mentioned operation modes of the lighting device. Moreover, the first light emitting element and the second light emitting element may be simultaneously and/or separately (individually) dimmed. For example, when the light intensity of the first light emitting element is increased, simultaneously, also the light intensity of the second light emitting element may be increased. Such a kind of regulation may be implemented using a single dimming device common to all light emitting elements (making the lighting device relatively technically simple). Hence, when both the first light emitting element and the second light emitting element are operated at a low dimmed level (i.e. at a low light intensity) the total light-output from the lighting device is low, thereby rendering visible the light guide which may provide a decorative appearance. In contrast, when the light emitting elements are driven at a high power level (i.e. at a high light intensity) the total light-output from the lighting device is high, thereby providing a functional lighting. It will be appreciated that such a kind of regulation with a common dimmer resembles the function of a traditional incandescent lighting device.

According to another example, wherein the light emitting elements are individually dimmed, the light intensity of the first light emitting element is increased while the light intensity of the second light emitting element is decreased. The above-mentioned effects (for resemblance to the function of a traditional incandescent lighting device) may be achieved and even enhanced, when the first light emitting element and the second light emitting element have different light intensities.

According to an embodiment of the invention, a wavelength (color) of the light emitted from the first light emitting element is adjustable, preferably in response to an input signal to the lighting device. For example, the color of the first light emitting element may be adjusted to be red/amber in the decorative mode and yellow/white in the functional mode.

In an embodiment of the invention, the input signal to the lighting device may be a current or a voltage supplied to the lighting device. Further, lighting device may comprise a circuitry with a transfer function correlating the input signal with a light-output and/or the light color of the first and second light emitting element. As an illustrating example, for a low input signal (such as in a dimmed traditional incandescent lamp), the first light emitting element may provide a red/amber color and have a relatively low light intensity, while the light intensity of the second light emitting element may preferably be turned off. The stronger the input signal is, the more the first light emitting element may become yellow/white (and the more the light output from the first light emitting element is increased) and, at some threshold value of the input signal, the second light emitting element switches on and light-output is slowly increased.

According to further embodiments of the present invention, the light guide may comprise an optical fiber, which is advantageous in that the optical fiber may resemble a carbon-filament. Alternately, the light guide may comprise a light guide plate, which may be designed in any desired way. For example, the light guide may be designed in any three-dimensional shape.

According to an embodiment of the present invention, the light guide may be provided with diffusing means for out-coupling light. The diffusing means enhances the out-coupling of the light guided into the light guide and thus, renders the light guide more clearly visible. In an embodiment of the invention, the structure of the out-coupling surface (e.g. the roughness of the surface) may be selected to adjust the scattering of the light. Further, the light guide may comprise (scattering or diffusing) particles and/or vacuum/gas bubbles for out-coupling light. In other words, distortions of the optical characteristics of the light guide are provided for scattering out some of the light. These distortions may be located on the surface/edge of the light guide and/or inside of the light guide. Generally, any optical distortion resulting in a change of the internal light angles may result in that part of the light is coupled out of the light guide. Distortions in a 3D-shaped light guide may for example be obtained by local laser heating.

According to an embodiment of the present invention, at least one of the first light emitting element and the second light emitting element may comprise at least one light emitting diode (LED), which is advantageous in that LEDs are high-efficient point-like light sources available in several different colors, thereby allowing various designs of the lighting device. Further, the LED may be a laser-LED, which is advantageous in that it improves the coupling of light to the light guide.

According to an embodiment of the invention, a string of a plurality of light emitting diodes may be provided in the light guide.

According to an embodiment of the present invention, the lighting device may further comprise an envelope encapsulating the first light emitting element, the second light emitting element and the light guide, which is advantageous in that the light emitting elements and the light guide will be protected against damage and dust. Additionally, the lighting device will resemble a traditional incandescent light bulb.

According to an embodiment of the present invention, the lighting device may further comprise a base at which the first light emitting element and the second light emitting element are arranged.

Optionally, the lighting device may further comprise a diffusing/scattering element arranged on top of the second light emitting element e.g. in the form of a plate covering the second light emitting element(s). Such a diffusing/scattering element is advantageous in that an individual light emitting element will be less visible and provide a more even light distribution than without a diffusing/scattering element.

Further objectives of, features of, and advantages with, the present invention will become apparent when studying the following detailed disclosure, the drawings and the appended claims. Those skilled in the art realize that different features of the present invention can be combined to create embodiments other than those described in the following. In particular, it will be appreciated that the various embodiments described for the lighting device are all combinable with the method as defined in accordance with the second aspect of the present invention.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

DETAILED DESCRIPTION OF EMBODIMENTS

Figure 1:
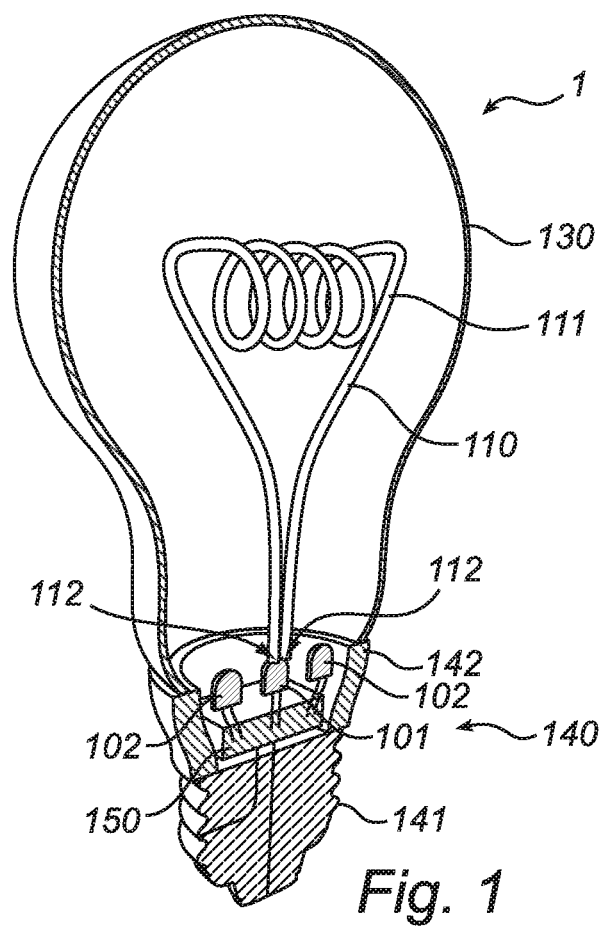
FIG. 1 shows a lighting device according to an embodiment of the present invention.

With reference to FIG. 1, there is shown a lighting device in accordance with an embodiment of the present invention.

FIG. 1 shows a lighting device 1 comprising a first light emitting element 101 and a second light emitting element 102. The first light emitting element 101 is optically coupled to a light guide 110 having an out-coupling surface 111. The optical coupling can be provided e.g. via an optical element (not shown) arranged between the first light emitting element 101 and the light guide 110 or by linking the first light emitting element 101 directly to the light guide 110, as shown in FIG. 1.

Optionally, the lighting device may be provided with additional first light emitting elements being optically coupled to the light guide 110. For example, one first light emitting element may be coupled to a first end of the light guide 110 and another first light emitting element may be coupled to another end of the light guide 110 (opposite to the first end).

Further, the lighting device may be provided with additional second light emitting elements 102 for providing functional lighting.

The first light emitting element 101 and/or the second light emitting element 102 may for instance be light emitting diodes, LEDs, such as e.g. laser LEDs. For example, an amber colored LED, providing a warm light, may be used as the first light emitting element 101, thereby resulting in a light guide resembling a warm glowing filament (when the first light emitting element is activated/on). An alternative is to provide e.g. phosphor (or any other wavelength converting material) on top of the light guide (i.e. at the out-coupling surface of the lightguide) and select a phosphor providing a warm colored light. According to another example, the first light emitting element 101 may comprise a red LED, a green LED and a blue LED, thereby together providing a white light, which may be modulated into different colors by controlling the red, green and blue LED.

Further, an LED of a colder color (which may be more efficient), such as white, may be used as the second light emitting element 102, thereby providing light being suitable for functional lighting. According to another example, the second light emitting element 102 may comprise a red LED, a green LED and a blue LED, thereby together providing a white light, which may be modulated into different colors by controlling the red, green and blue LED. However, it will be appreciated that the invention is not limited to such color configuration, the light emitting elements 101, 102 in the lighting device may be of any desired color.

The light guide 110 may comprise an optical fiber (like an optical wave guide) made of a suitable material such as plastics or glass-fiber. The use glass-fiber material is advantageous because of its optical quality and material characteristics (e.g. sensitivity to heat). The optical fiber may be of a shorter or longer length allowing a simple or more complex design. For example, the optical fiber may be spirally wound in order to resemble a traditional retro-filament.

The out-coupling of light from the out-coupling surface 111 of the light guide 110 may be achieved (and/or enhanced) in different ways. Some of the light may be out-coupled due to curvatures of the light guide 110. Moreover, the light guide 110 may be provided with diffusing means for out-coupling the light. In general, any optical distortion added to the light guide will provide out-coupling of light. The diffusing means may be provided e.g. by making the out-coupling surface 111 rough (e.g. by sand-blasting, scratching, or molding in a texture in the surface), or by providing indents or small protrusions in the out-coupling surface 111. Further, particles (e.g. white paint) and/or vacuum/gas bubbles (e.g. created by local laser heating) may be provided on or inside the light guide such that light is scattered out of the light guide.

According to an embodiment of the present invention, the light guide 110 may comprise at least one connecting port 112 to which the first light emitting element 101 may be optically coupled. The present embodiment is advantageous in that it allows a great part of the light emitted from the first light emitting element 101 to be received and out-coupled by the light guide 110, thereby serving a decorative purpose, and still a great part of the light emitted from the second light emitting element 102 provides an illumination without unnecessary considerable energy-losses in any light guide.

However, some (i.e. a relatively small part) of the light emitted from the second light emitting element(s) 102 may be coupled into the light guide 110 via the out-coupling surface 111, and thus, coupled out again via the out-coupling surface 111, thereby contributing to the illumination out of the light guide 110.

Figure 2:
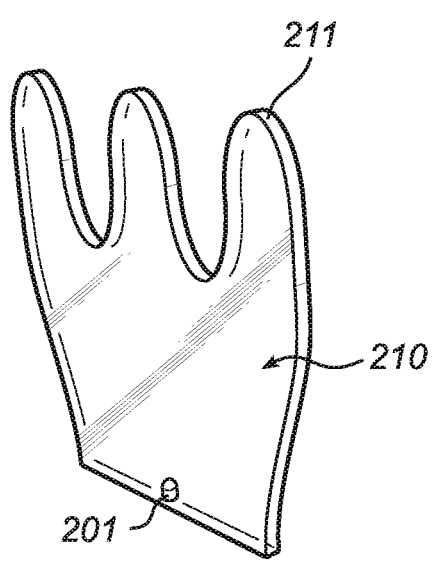
FIG. 2 shows a light guide according to an embodiment of the present invention.

With reference to FIG. 2, there is shown an alternative design of a light guide according to an embodiment of the invention. FIG. 2 shows a light guide in the form of a light guide plate 210 being optically coupled to a first light emitting element 201. Some of the light emitted from the first light emitting element 201 is coupled out via an edge 211 which may be curved (and optionally rough), thereby resulting in the appearance of a filament such as in a traditional light bulbs. Further, light may be coupled out via diffusing means provided inside the light guide plate 210 or on the surface of the light guide plate 210.

It will be appreciated that the light guide may be designed in any desired three-dimensional shape, such as a spherical or prismatic shape. Further, the diffusing means may be provided at any desired position in or on the light guide. For example, the diffusing means may form a pattern (such as a filament-resembling pattern).

Figure 3:
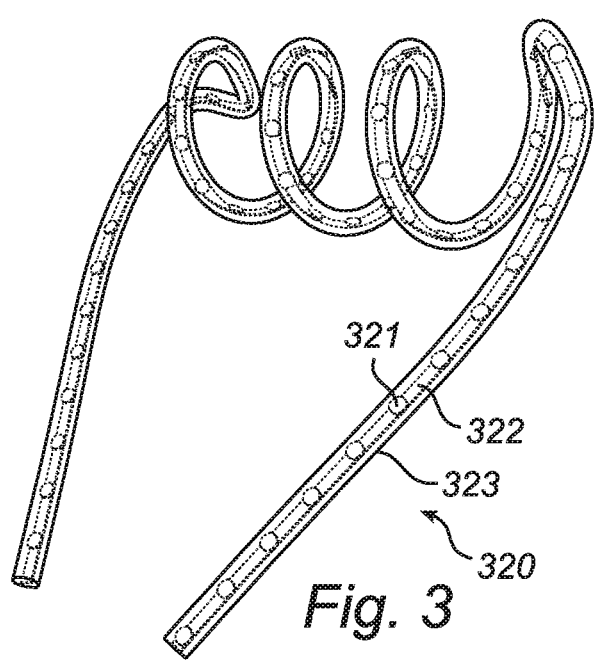
FIG. 3 shows a light guide according to another embodiment of the present invention.

With reference to FIG. 3, there is shown another design of a light guide according to yet another embodiment of the invention. FIG. 3 shows a light guide 320 in the form of a continuous optical element 323 in which a string of a plurality of LEDs 321 is arranged. The LEDs 321 may be mounted on a small flexible PCB (printed circuit board) 322 with the continuous optical element 323 on top of it (or encapsulating it).

Turning again back to FIG. 1, further embodiments of the invention will be described. The lighting device 1 may further comprise an envelope 130 encapsulating the first light emitting element 101, the second light emitting element 102 and the light guide 110. Preferably, the envelope 130 is transparent (or at least semi-transparent) such that the light guide 110 is visible for providing a decorative effect. Further, the envelope 130 may be formed as a bulb resembling a traditional incandescent light bulb. The lighting device 1 may further comprise a base 140 at which the first light emitting element 101 and the second light emitting element 102 are arranged. The base 140 may comprise a bayonet base or a screw base 141 (e.g. of the type E14, E26 or E27), which is advantageous in that the lighting device can be fitted in conventional lamp fittings and used as a replacement for a traditional incandescent light bulb (retrofitting). The base 140 may further comprise a heat-sink 142 for cooling the light emitting diodes 101, 102. Optionally, the light emitting elements 101, 102 may be arranged such that an upper portion of the heat-sink 142 (or an upper portion of the base 140) hides the light emitting elements 101, 102 (as shown in FIG. 1) for reducing the risk of direct view of them. Further, the inside of the upper portion of the heat-sink 142 may be reflective such that all (or at least almost all) light emitted from the light emitting elements 101, 102 can be output from the lighting device.

The lighting device may further comprise a diffusing/scattering element (not shown) in form of a plate on top of the second light emitting elements 102. For example, such plate may be arranged on top of the base 140. The plate may be provided with a hole where light emitted from the first light emitting element 101 may go through to be coupled into the light guide 110.

The lighting device 1 may further comprise electronic driving means 150 provided with a power supply for converting the mains voltage supply into an output signal suitable for driving the light emitting elements 101, 102. The electric driving means 150 may further comprise an electronic circuitry configured to control the light intensity of the first light emitting element 101 and/or the second light emitting element 102 such that the light intensity of the second light emitting element 102 is adjustable relative to the light intensity of the first light emitting element 101. Further, the electronic circuitry may be configured to slightly modulate the brightness (or color) of the first light emitting element 101, or to sequentially switch on and off the first light emitting element 101, for providing a flame and flickering effect of the light guide 110. The electronic circuitry may further contain a transfer function for correlating an input signal (such as input current or input voltage) with a light output and/or an emission color of the first and second light emitting elements. The electric driving means 150 may be controlled by a remote control unit, by buttons on the base 140 or by any other type of user interface.

In an embodiment of the invention, the first light emitting element 101 and/or the second light emitting element 102 may be dimmable. In an embodiment of the invention, the lighting device supports traditional incandescent light dimmers such that the light emitting elements can operate in a dimmed mode.

Figure 4:
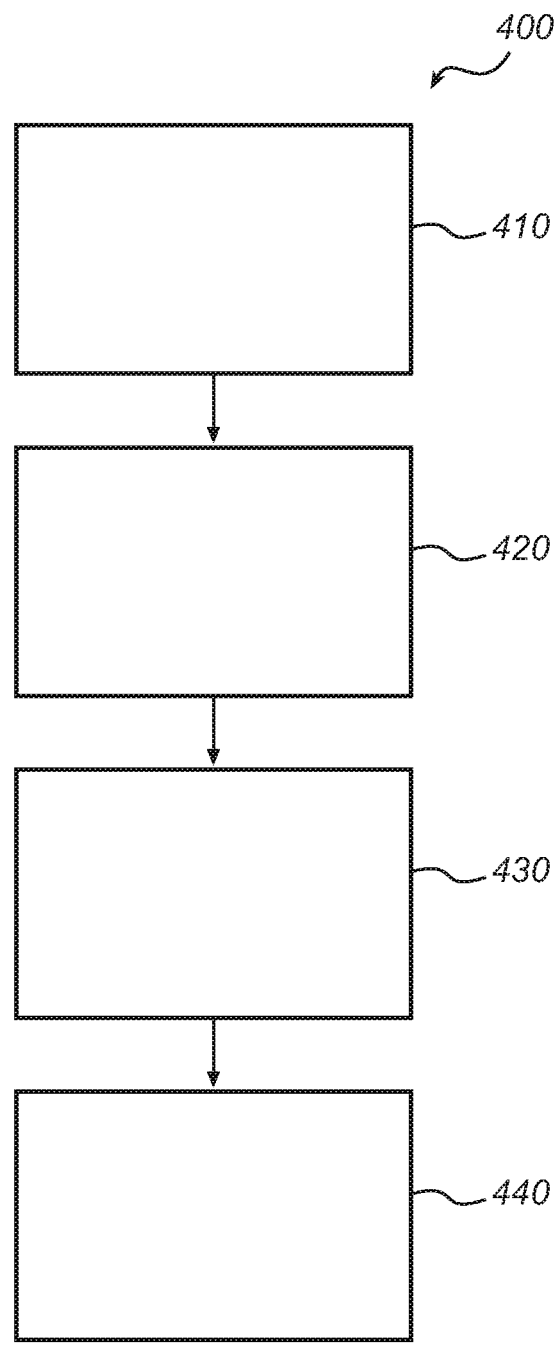
FIG. 4 is a general outline of a method of manufacturing a lighting device according to an embodiment of the present invention.

With reference to FIG. 4, a method of manufacturing a lighting device according to an embodiment of the present invention will be described. FIG. 4 shows the general outline of a method 400 of manufacturing a lighting device. The method comprises a step 410 of providing a first light emitting element, a step 420 of providing a light guide having an out-coupling surface, and a step 430 of optically coupling the first light emitting element to the light guide. Further, the method 400 comprises a step 440 of providing a second light emitting element dedicated for direct illumination from the lighting device.

While specific embodiments have been described, the skilled person will understand that various modifications and alterations are conceivable within the scope as defined in the appended claims.

For example, additional light guides with associated first light emitting elements may be provided in the lighting device. Further, the lighting device can be applied in stand-alone retro-fit incandescent bulb replacements as well as in dedicated new luminaries. Moreover, the lighting device is not limited to be designed as a conventional light bulb. It can also be designed e.g. as a tubular-shaped lamp with connectors at both ends of the tube.

The invention claimed is:

1. A lighting device for providing decorative lighting comprising:
    a base comprising a heat-sink;
    an optical element coupled to the base, the optical element comprising:
        a first light emitting element is provided as a string of a plurality of light emitting diodes;
        a light guide encapsulating the plurality of light emitting diodes and having an out-coupling surface for decorative illumination via the light guide;
    an envelope encapsulating the optical element;
    wherein the out-coupling surface is located on a portion of the light guide that is in the shape of a spiral filament;
    wherein the lighting device resembles a traditional incandescent light bulb comprising a filament due to at least one of a shape of the light guide, a color of the decorative illumination, an intensity of the decorative illumination, and the decorative illumination via the light guide;
    second light emitting elements disposed on the base, each spaced apart from each other, and configured to emit light directly without having any light guide, wherein the second light emitting elements disposed on the base comprise light emitting diodes (LEDs); and
    an upper portion of the heat-sink positioned to hide the second light emitting elements disposed on the base, wherein the upper portion of the heat-sink includes a reflective surface to output light emitted from the second light emitting elements disposed on the base.

2. The lighting device as defined in claim 1, wherein the first light emitting element is dimmable; the lighting device further comprises an electric driving circuit provided with a power supply for converting mains voltage supply into an output signal suitable for driving the first light emitting element; the driving circuit is configured to control the light intensity of the first light emitting element, and the electric driving circuit is further configured to modulate the brightness or color of the first light emitting element.

3. The lighting device as defined in claim 2, wherein the electric driving circuit is configured to control the light intensity of the second light emitting elements.

4. The lighting device as defined in claim 3, wherein the electric driving circuit adjusts the light intensity of the second light emitting elements relative to the light intensity of the first light emitting element.

5. The lighting device as defined in claim 1, wherein the second light emitting elements comprise white LEDs configured to provide functional lighting.

6. The lighting device as defined in claim 1, wherein electric driving circuit is configured to sequentially switch on and off the first light emitting element, for providing a flame and flickering effect of the light guide.

7. The lighting device as defined in claim 1, wherein the first light emitting element comprises at least a red LED, a green LED, and a blue LED; wherein the lighting device further comprises an electric driving circuit provided with a power supply for converting mains voltage supply into an output signal suitable for driving the first light emitting element;

wherein at least one of the red LED, the green LED, and the blue LED are modulated into different colors by controlling the red, the green and the blue LED.

8. The lighting device as defined in claim 1, wherein the envelope comprises a globular structure that encloses the first emitting element and the second light emitting elements.

9. The lighting device as defined in claim 1, wherein the plurality of light-emitting diodes are mounted on a flexible printed circuit board and wherein the plurality of light-emitting diodes and flexible printed circuit board are encapsulated within the continuous optical element to provide the decorative illumination.

* * * * *